US012727136B2

(12) United States Patent
Chen

(10) Patent No.: US 12,727,136 B2
(45) Date of Patent: Sep. 1, 2026

(54) CARRYING DEVICE FOR SUBSTRATE CARRIER

(71) Applicant: GROUP UP INDUSTRIAL CO., LTD., Taoyuan City (TW)

(72) Inventor: An-Shun Chen, Taoyuan City (TW)

(73) Assignee: GROUP UP INDUSTRIAL CO., LTD., Taoyuan City (TW)

( * ) Notice: Subject to any disclaimer, the term of this patent is extended or adjusted under 35 U.S.C. 154(b) by 373 days.

(21) Appl. No.: 18/505,190

(22) Filed: Nov. 9, 2023

(65) Prior Publication Data

US 2025/0159853 A1 May 15, 2025

(51) Int. Cl.
*H10P 72/00* (2026.01)
*H05K 13/00* (2006.01)
*H05K 13/02* (2006.01)

(52) U.S. Cl.
CPC ..... *H05K 13/0015* (2013.01); *H05K 13/0069* (2013.01); *H05K 13/0084* (2013.01); *H05K 13/021* (2013.01)

(58) Field of Classification Search
CPC ................................ H10P 72/00; H10P 72/78
See application file for complete search history.

(56) References Cited

U.S. PATENT DOCUMENTS 3,787,039 A * 1/1974 Zeichman ................ B25H 1/00 108/150
11,697,189 B2 * 7/2023 Chartier .................. B25B 5/106 29/559
2017/0197296 A1 * 7/2017 Isusi ......................... B25B 1/06
2020/0070318 A1 * 3/2020 Parks ...................... B25B 5/145
2025/0159853 A1 * 5/2025 Chen .................. H05K 13/0084

* cited by examiner

*Primary Examiner* — Lee D Wilson

(57) ABSTRACT

A carrier device for substrate carriers is provided, having loading grooves on the upper part of a carrier body. Protruding blocks are formed on opposite sides of the loading grooves. Each protruding block is rotatably provided with first rollers protruding into the loading groove, and the bottoms of the loading grooves are rotatably provided with second rollers. Abase of the carrier body is also provided with positioning grooves, positioning blocks are formed on opposite sides of the positioning grooves, and the positioning blocks are rotatably provided with positioning rollers protruding into the positioning groove. The upper side of the substrate carrier is vertically placed into the loading groove guided by the first rollers and supported on the second rollers, while the lower end of the substrate carrier is guided by the positioning rollers and enters the positioning groove for positioning, thereby preventing dust generated from the friction.

9 Claims, 8 Drawing Sheets

CARRYING DEVICE FOR SUBSTRATE CARRIER

BACKGROUND OF THE INVENTION

1. Field of the Invention

The present invention relates generally to a carrying device used to carry a substrate carrier for fixing a flexible board in the process of manufacturing the flexible board, and more particularly, to a carrying device for a substrate carrier, in the process of placing the substrate carrier onto or retrieving from the carrier body, to avoid the problem of affecting production environment cleanness caused by the dust generated by the friction between the substrate carrier and the carrier body.

2. The Prior Arts

The IC substrate is a circuit board on which the chips are disposed, that is, the carrier of the chips. When the chips are installed, the circuit inside the IC substrate is used to connect the signal between the chips and the printed circuit board (PCB); the IC substrate is very small, very thin (about 0.2-0.4 mm), flexible, and is a high-precision circuit board.

Since the IC substrate is soft, when handling and transporting during the manufacturing process, the IC substrate needs to be fixed on the carrier and then transported together with the carrier. In practice, the IC substrate is usually fixed on a substrate carrier and a plurality of substrate carriers are transported to the substrate carrying device for storage and arranged to accumulate to a predetermined number, and then the substrate carrying device is transported together to the next predetermined process area. In addition, other flexible circuit boards and flexible board bodies generally need to be transported with the substrate carrier during the manufacturing process.

The structure of the conventional substrate carrying device is that a carrier body is provided with a plurality of loading grooves, and the loading grooves are U-shaped or V-shaped. When the substrate carrier is transported to the carrier body, the substrate carrier is placed so that the protruding parts formed on the sides of the substrate carrier are directly placed into the loading groove, and when the substrate carrier is to be retrieved, the substrate carrier is moved out of the loading groove. However, when the substrate carrier is placed in or removed from the loading grooves, dust will be generated due to varying degrees of friction between the substrate carrier and the side walls and bottom of the loading grooves, affecting the cleanness of the production environment, especially when the protruding parts of the substrate carrier are placed into the loading groove and contact the bottom, an impact force will be generated due to the gravity of the substrate carrier, resulting in greater friction and the generation of more dust.

SUMMARY OF THE INVENTION

A primary objective of the present invention is to provide a carrying device for substrate carriers that, in the process of placing the IC substrate carrier onto or retrieving from the carrier body, can avoid the problem of affecting IC substrate production environment cleanness caused by the dust generated by the friction between the substrate carrier and the carrier body.

The technical means of the carrying device for substrate carriers provided by the present invention includes: a carrier body, with an upper part provided with at least one loading groove for carrying a plurality of substrate carriers, and the at least one loading groove being provided with protruding blocks on opposite sides; a plurality of first rollers, respectively rotatably arranged on each of the protruding blocks, and the first rollers having an outer edges protruding into the loading grooves; and at least one second roller, respectively rotatably arranged at a bottom of the loading grooves. Through the structure of the carrying device, when the protruding parts on the side of the substrate carrier are inserted into or removed from the loading groove of the carrying device, the substrate carriers will not directly rub against the side walls of the loading groove, but will instead rub against the high hardness and low friction coefficient of the rollers to create rolling contact, thus avoiding the generation of dust.

In a preferred embodiment of the present invention, the carrier body comprises a base and side walls connected to opposite sides of the base, and the loading grooves are respectively provided at the upper parts of the side walls. With the above structure, protruding parts can be formed on opposite sides of the substrate carrier, and the protruding parts on both sides can be placed across the loading grooves on both sides of the carrier.

A preferred embodiment of the present invention further comprises an upper roller seat disposed at the upper end of the side wall, and at least one of the loading grooves and the plurality of protruding blocks are formed on the upper roller seat. With the above structure, the loading grooves and protruding blocks can be pre-formed on the upper roller seat, and then the upper roller seat can be installed on the side wall of the carrier to simplify the manufacturing process.

A preferred embodiment of the present invention comprises a plurality of the loading grooves arranged in a straight line, central axes of the first rollers provided on the protruding blocks are parallel to longitudinal axes of the loading grooves, and the central axes of the second rollers are perpendicular to the longitudinal axes of the loading grooves. With the above structure, when the protruding parts of the substrate carrier is placed in or retrieved from the loading groove, the sides can make rolling contact with the first roller to be guided into or retrieved from the loading groove, and when the lower edge of the protruding part contacts the second roller, the substrate carrier moves horizontally on the second roller to adjust the position of the substrate carrier.

In a preferred embodiment of the present invention, two first rollers and one second roller are configured as a set, and the central axes of the first rollers provided on the protruding blocks are parallel to the longitudinal axis of the loading grooves, and the axis of the second roller is perpendicular to the longitudinal axis of the loading groove.

In a preferred embodiment of the present invention, a buffer element is provided respectively on opposite sides of the loading grooves to act upon the two ends of axles of the second rollers to absorb impact force. With the above structure, when the protruding part of the substrate carrier is put into the loading groove and contacts the second roller, the impact force will be absorbed by the buffer element to reduce friction, thereby minimizing the probability of dust generation.

The buffer element is a spring, or other elastic elements.

In a preferred embodiment of the present invention, a lower roller seat is also provided on the base; the lower roller seat is provided with at least one positioning groove for positioning the substrate carrier; positioning blocks are formed on opposite sides of the at least one positioning groove, each positioning block is rotatably provided with positioning rollers, and outer edges of the positioning rollers protrude into the positioning groove. With the above structure, when the protruding part of the substrate carrier is placed in the loading groove, both sides of the lower end of the substrate carrier are also in rolling contact with the positioning rollers and are guided into the positioning groove to prevent the lower end of the substrate carrier from hanging in the air and shaking.

In a preferred embodiment of the present invention, a lower roller is also provided at bottom of the positioning groove. Through the above structure, the lower side of the substrate carrier placed in the positioning groove is supported.

In a preferred embodiment of the present invention, the first roller, the second roller, and the positioning roller are made of low friction coefficient materials such as quartz, glass, alloy, ceramic or plastic.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Unless otherwise defined, all technical and scientific terms used herein have the same meaning as commonly understood by those skilled in the technical field of the present invention. The terminology used in the description of the present invention is only for the purpose of describing specific embodiments and is not intended to limit the present invention.

First Embodiment

Figure 1:
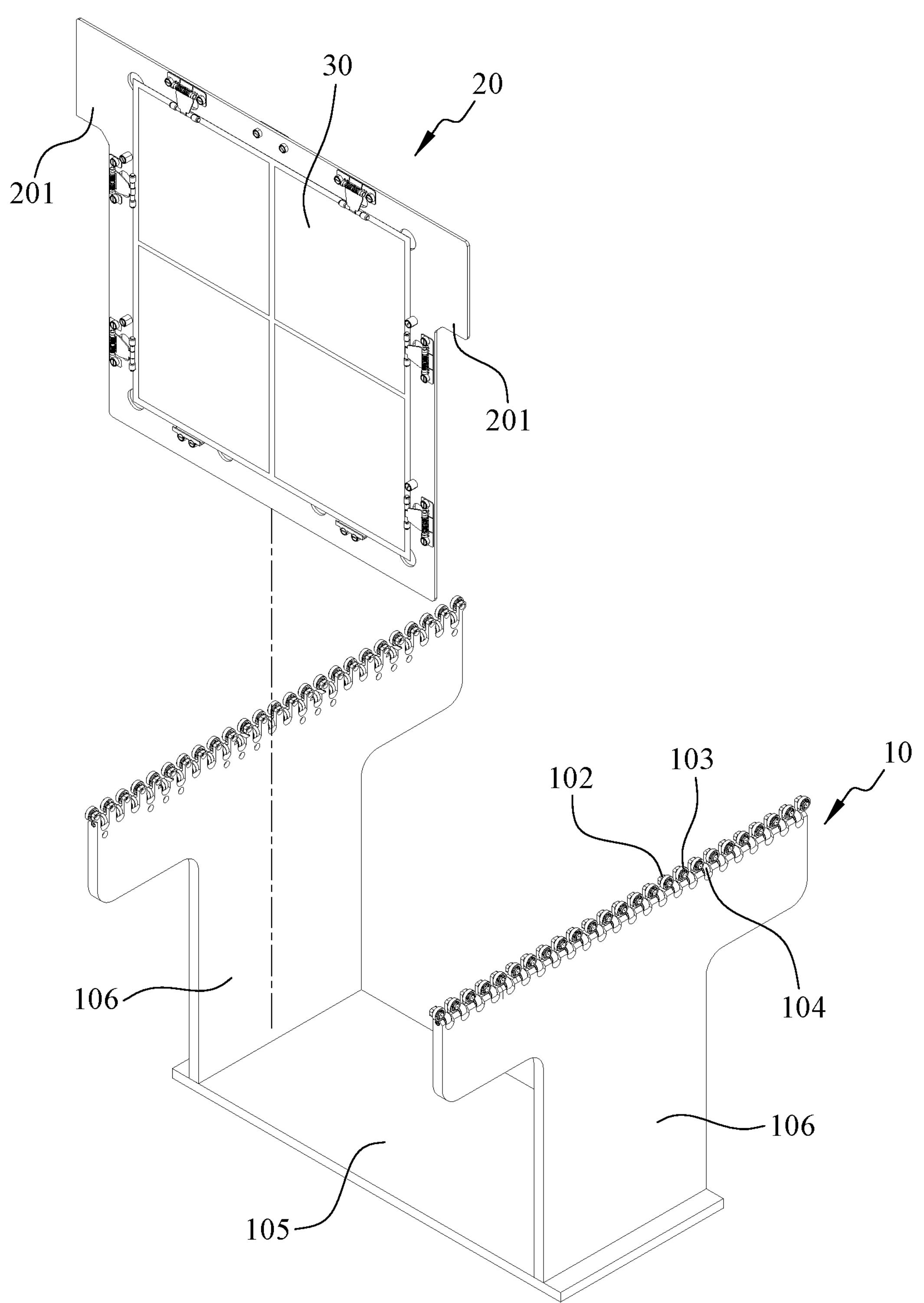
FIG. 1 is a partial perspective view showing the structure of the first embodiment of the present invention.
Figure 2:
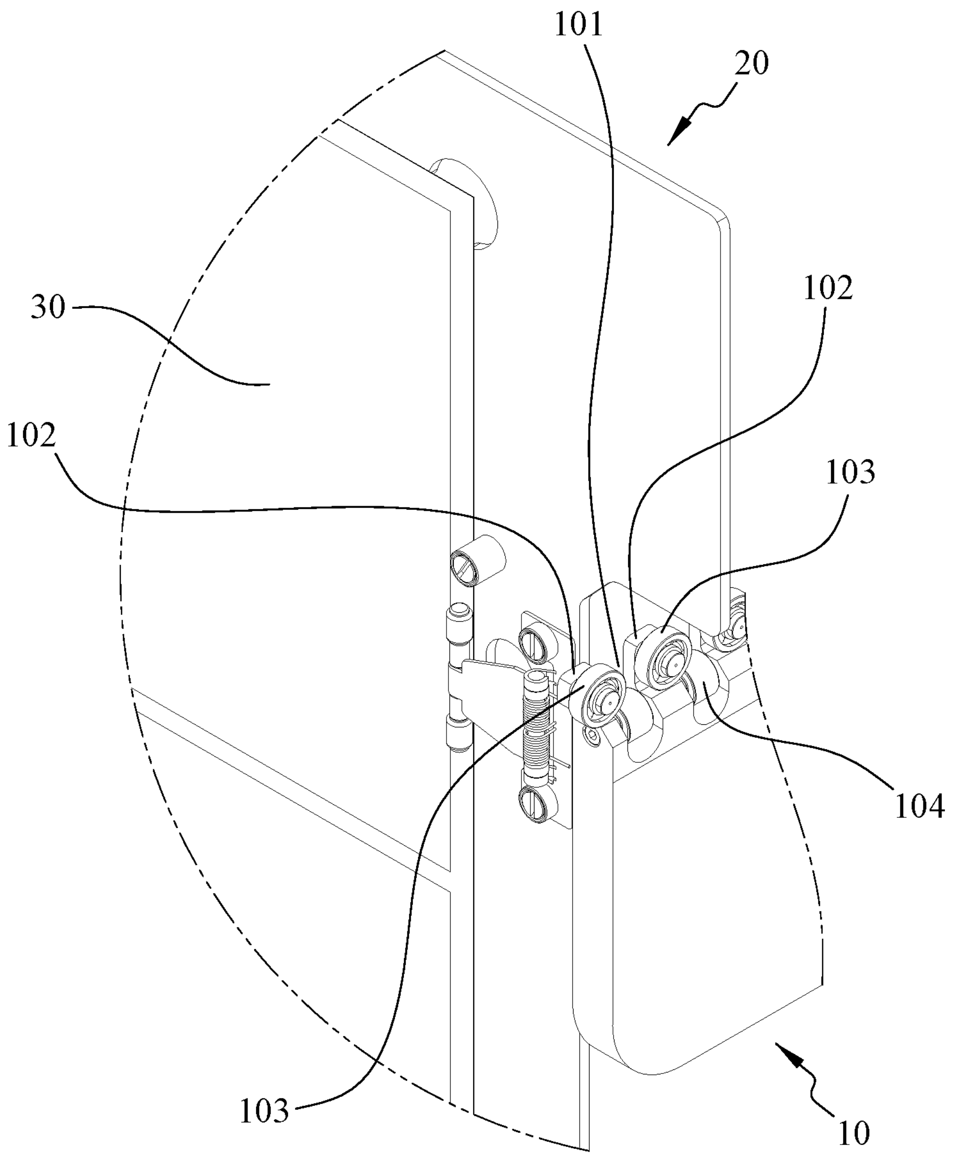
FIG. 2 is a partially enlarged exploded view of FIG. 1.

FIGS. 1 and 2 show that the first embodiment of the carrying device for substrate carriers provided by the present invention, comprising: a carrier body 10, the upper part of the carrier body is provided with a plurality of loading grooves 101 for loading a plurality of substrate carriers 20. Protruding blocks 102 are formed on opposite sides of the loading grooves 101. Each protruding block 102 is rotatably provided with a first roller 103, and the outer edge of the first roller 103 protrudes into the loading groove 101, and a second roller 104 is rotatably provided at the bottom. More specifically, based on practical considerations, the present invention can form a base 105 on the carrier body 10, and two side walls 106 connected on opposite sides of the base 105 and extending upward parallel to each other. In one embodiment, the loading grooves 101 and the protruding blocks 102 can be integrally formed on the upper parts of the side walls 106, and the loading grooves 101 are linearly arranged on the side walls 106. The central axes of the first rollers 103 provided on the protruding blocks 102 are parallel to the longitudinal axis of the loading groove 101, and the central axes of the second rollers 104 are perpendicular to the longitudinal axis of the loading groove 101.

With the above structure, the protruding parts 201 formed on the opposite sides of the substrate carrier 20 for fixing the flexible substrate 30 can be placed in the loading grooves 101 on both sides of the carrier 10 to secure the substrate carrier 20 to be carried on the carrier body 10. When the protruding parts 201 on the side of the substrate carrier 20 is inserted into or retrieved from the loading groove 101 of the carrier body 10, the protruding part 201 will not directly rub against the side wall of the loading groove 101, but will form a rolling contact with the first roller 103, and when the protruding part 201 is placed on the second roller 104 at the bottom of the carrying groove 101, the lateral displacement of the substrate carrier 20 can be adjusted in the horizontal direction through the rolling of the second roller 104; that is, by the contact between the protruding part 201 of the substrate carrier 20 and the first roller 103 and the second roller 104 made of materials with low friction coefficient, the present design can avoid dust generated by friction and affecting the production environment. Preferably, the first roller 103 and the second roller 104 are made of low friction coefficient materials such as quartz, glass, alloy, ceramic or plastic.

Second Embodiment

Figure 3:
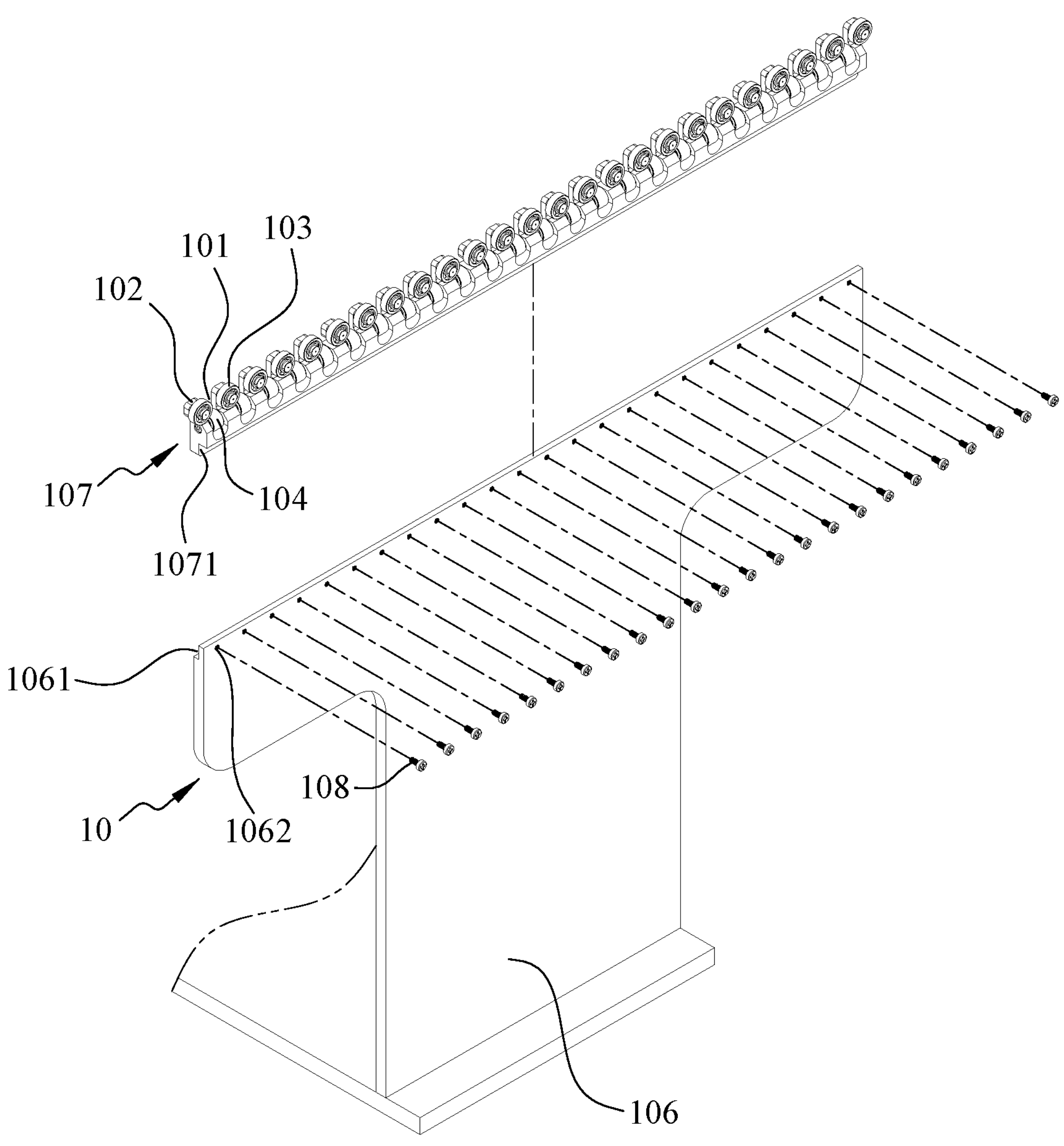
FIG. 3 is a schematic perspective view showing the structure of the second embodiment of the present invention.
Figure 4:
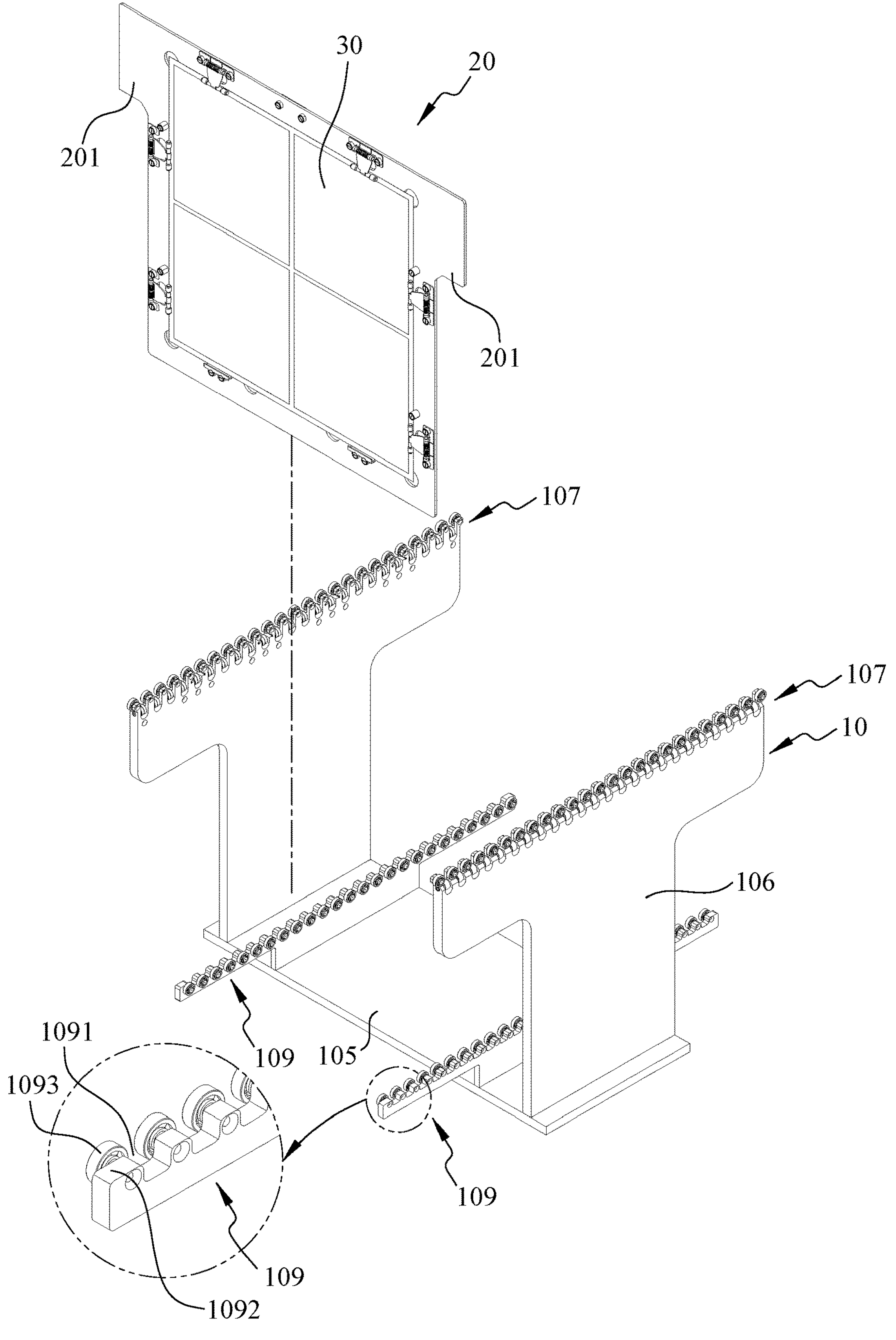
FIG. 4 is a partial perspective view showing the structure of the third embodiment of the present invention.

FIG. 3 shows a second embodiment of the present invention. An upper roller seat 107 is provided, and the loading groove 101 and the protruding block 102 of the aforementioned structure are integrally formed on the upper roller seat 107. Similarly, each protruding block 102 is rotatably provided with a first roller 103, and the outer edge of the first roller 103 protrudes into the loading groove 101; a second roller 104 is rotatably provided at the bottom of the loading groove 101. With the above structure, the loading groove 101 and the protruding block 102 can be pre-formed on the upper roller seat 107, and then the upper roller seat 107 is installed on the upper side wall 106 of the carrier body 10 to simplify the manufacturing process. Specifically, the upper edge of the side wall 106 can form a first step part 1061, and a plurality of holes 1062 penetrating to the first step part 1061 are provided on the side wall 106. The first step part 1061 matches the second step part 1071, and a plurality of screw holes (not shown) corresponding to the holes 1062 are provided in the first step part 1061. Accordingly, when the second step part 1071 of the upper roller base 107 matches the first step part 1061 of the carrier body 10, the hole 1062 and the screw hole are linearly aligned, and then the screw 108 is used to pass through the hole 1062 and lock into the screw hole to secure the upper roller seat 107 to the carrier body 10 (as shown in FIG. 4). In the second embodiment, two first rollers 103 and one second roller 104 can also be arranged as a set on the upper roller seat 107, and then the upper roller seat 107 is installed on the upper part of the side wall 106.

Third Embodiment

Figure 5:
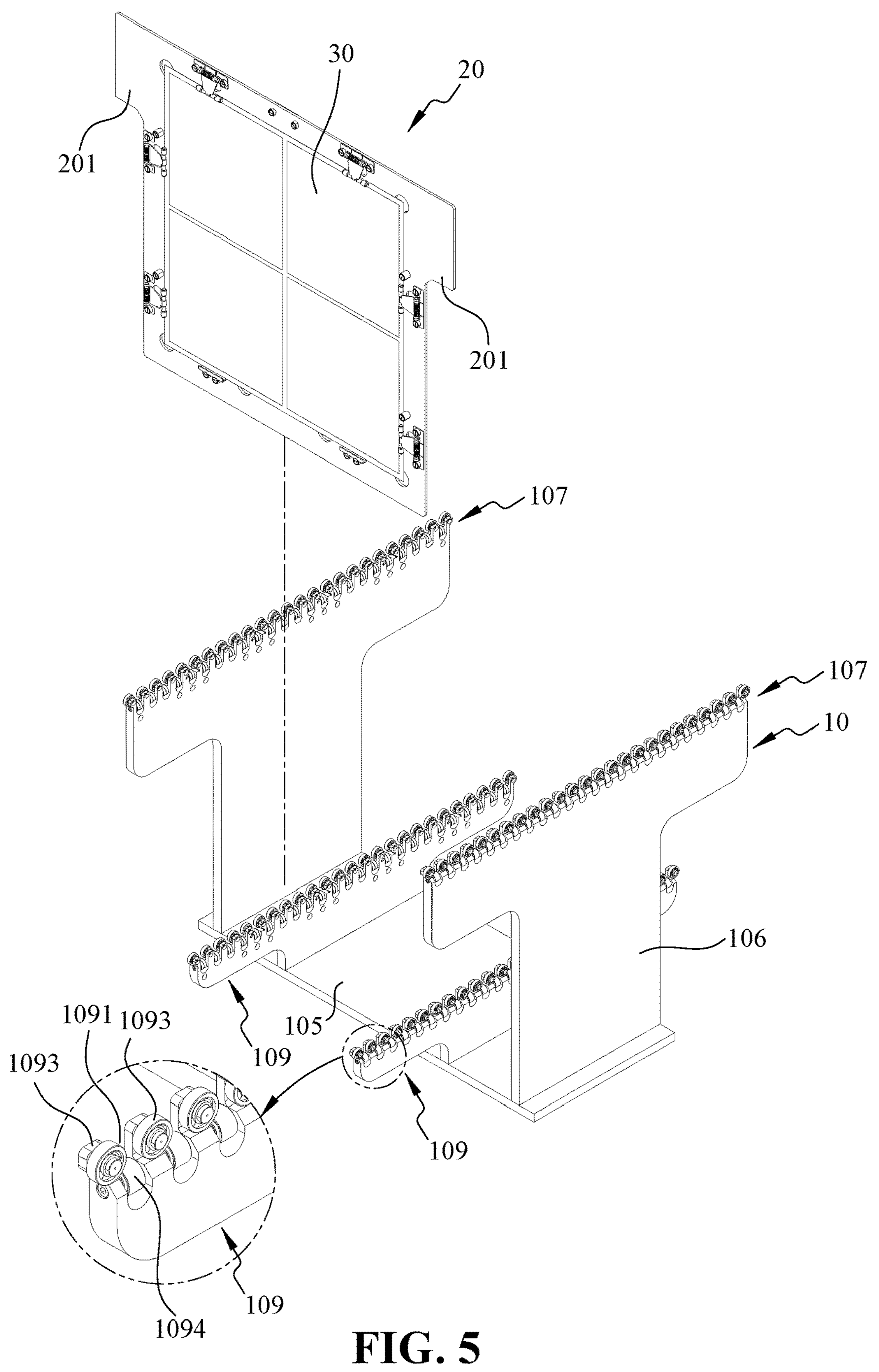
FIG. 5 is a schematic view showing the structure of the third embodiment of the present invention provided with lower rollers between the positioning rollers.

FIG. 4 shows a third embodiment of the present invention, which is further provided with at least one lower roller seat 109 on the base 105 of the carrier body 10 on the basis of the structure shown in FIGS. 1 and 2. In the present embodiment, two lower roller seats 109 are provided. The lower roller seat 109 is provided with a plurality of linearly arranged positioning grooves 1091. Positioning blocks 1092 are formed on opposite sides of the positioning grooves 1091. Each positioning block 1092 are rotatably provided with positioning rollers 1093, and the outer edges of the positioning rollers 1093 protrude into the positioning groove 1091. A lower roller 1094 is provided at the bottom of the positioning groove 1091 (as shown in FIG. 5). With the above structure, when the protruding part 201 of the substrate carrier 20 is placed in the loading groove 101, both sides of the lower end of the substrate carrier 20 are also in rolling contact with the positioning rollers 1093 and are guided into the positioning groove 1091. To prevent the lower end of the substrate carrier 20 from handing and shaking, and when the lower roller 1094 is provided, the lower roller 1094 is also used to support the lower edge of the substrate carrier 20.

Figure 6:
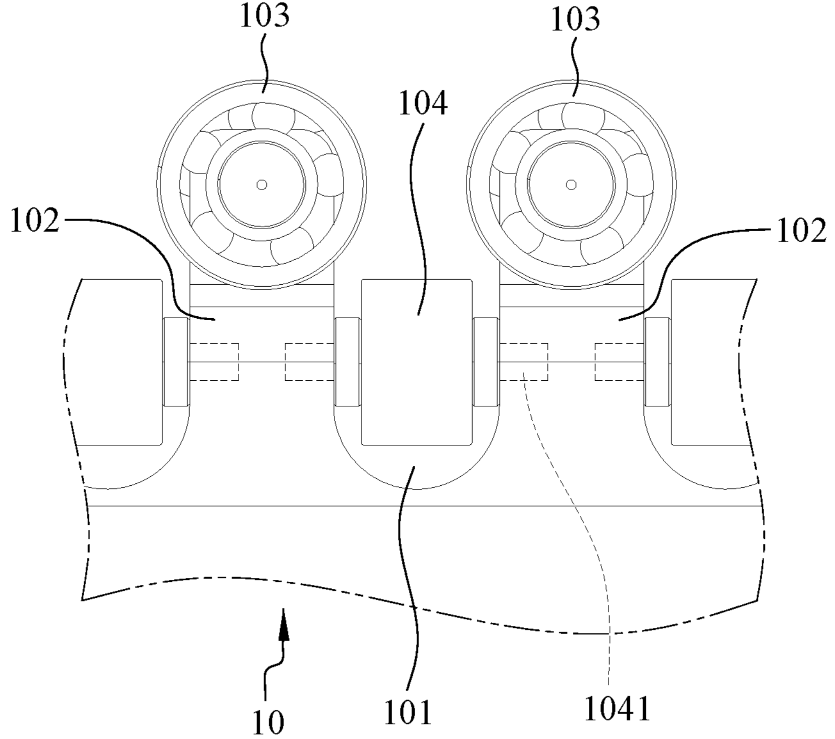
FIG. 6 is a partial planar view showing the structure of the first roller and the second roller of the present invention arranged on the carrier body.
Figure 7:
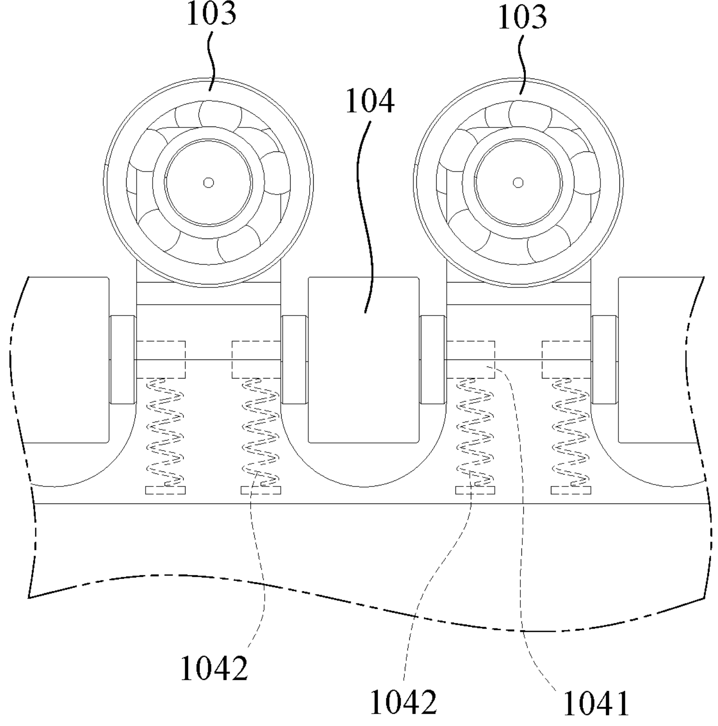
FIG. 7 is a schematic structural view showing the second roller shown in FIG. 4 provided with a buffer element.
Figure 8:
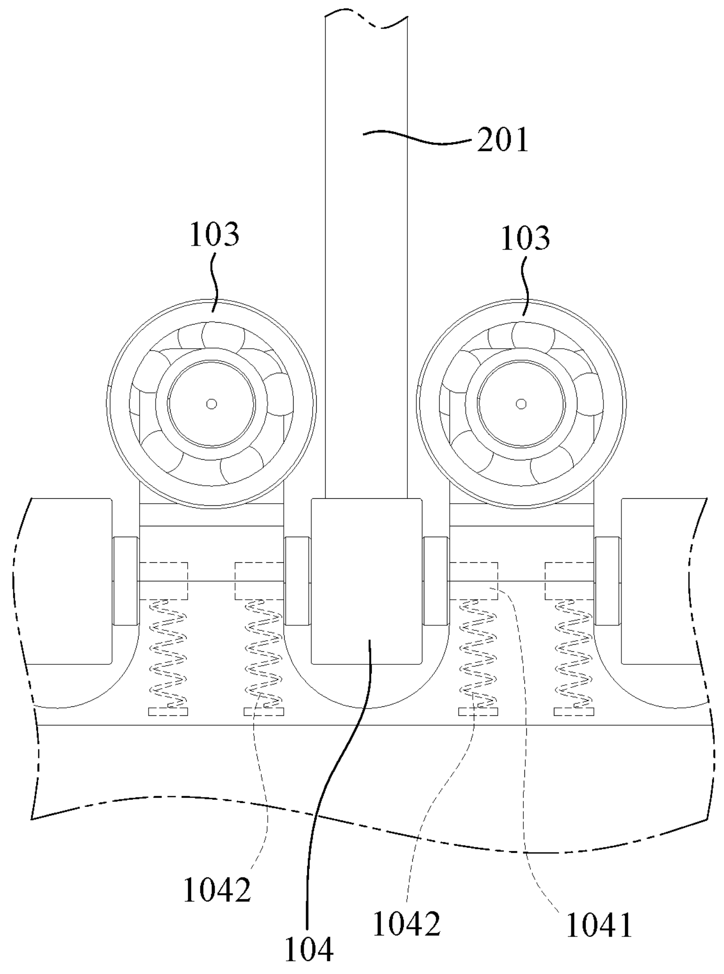
FIG. 8 shows a state in which the substrate carrier is placed between two first rollers and supported by the second roller in the embodiment shown in FIG. 7.

FIGS. 6 and 7 respectively show the arrangement relationship and structure of the first roller 103 and the second roller 104 in the structures of the first, second and third embodiments. FIG. 6 shows that a plurality of loading grooves 101 for carrying a plurality of substrate carriers 20 are provided. The protruding blocks 102 are formed on opposite sides of the loading grooves 101. Each protruding block 102 is rotatably provided with a first roller 103, and the outer edge of the first roller 103 protrudes into the loading groove 101; a second roller 104 is rotatably disposed at the bottom of the loading groove 101; wherein, the axle 1041 of the second roller 104 is rotatably but immovably arranged on the opposite side walls of the loading groove 101. FIG. 7 shows that the axle 1041 of the second roller 104 is rotatably and movably arranged on the opposite side walls of the loading groove 101; specifically, the axle 1041 of the second roller 104 is disposed on the opposite sides of the loading groove 101 in a penetrating manner on the vertical groove of the opposite two side walls, a buffer element 1042 is provided inside the side wall to support the axle 1041. The buffer element 1042 can be a compression spring or any other suitable elastic element; accordingly, both ends of the axle 1041 of the second roller 104 are respectively acted on by the buffer element 1042 to achieve the effect of absorbing impact force. As shown in FIG. 8, with the structure shown in FIG. 7, when the protruding part 201 of the substrate carrier 20 is placed in the carrying groove 101 and contacts the second roller 104, the impact force can be absorbed by the buffer element 1042 to reduce friction. This can minimize the chance of generating dust.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A carrying device for substrate carriers, comprising:
a carrier body, with an upper part provided with a plurality of loading grooves for carrying the substrate carriers, and each of the plurality of loading grooves being provided with protruding blocks on opposite sides;
a plurality of first rollers, respectively rotatably arranged on each of the protruding blocks, and the first rollers each having an outer edge protruding into the loading grooves; and
at least one second roller disposed between every two first rollers corresponding to one loading groove and rotatably arranged at a bottom of the corresponding loading groove;
wherein a central axis of each of the first rollers is perpendicular to a central axis of the at least one second roller.

2. The carrying device according to claim 1, wherein the carrier body comprises a base and side walls connected to opposite sides of the base, and the loading grooves are provided at upper parts of the side walls.

3. The carrying device according to claim 2, further comprising an upper roller seat disposed at an upper end of the side wall, and the loading grooves and the protruding blocks being formed on the upper roller seat.

4. The carrying device according to claim 1, wherein a plurality of the loading grooves are arranged in a straight line, the central axes of the first rollers provided on the protruding blocks are perpendicular to the straight line, and the central axis of the at least one second roller is parallel to the straight line.

5. The carrying device according to claim 4, wherein a buffer element is provided respectively on opposite sides of each loading groove to act upon two ends of an axle of the at least one second roller to absorb an impact force.

6. The carrying device according to claim 5, wherein the buffer element is a spring.

7. The carrying device according to claim 2, wherein a lower roller seat is also provided on the base; the lower roller seat is provided with at least one positioning groove for positioning the substrate carriers; positioning blocks are formed on opposite sides of the at least one positioning groove, each positioning block is rotatably provided with a positioning roller, and an outer edge of the positioning roller protrudes into the at least one positioning groove.

8. The carrying device according to claim 7, wherein a lower roller is also provided at a bottom of the at least one positioning groove.

9. The carrying device according to claim 7, wherein the first roller, the second roller, and the positioning roller are made of quartz, glass, alloy, ceramic or plastic.

* * * * *